(12) United States Patent
Khlat

(10) Patent No.: US 12,719,446 B2
(45) Date of Patent: Aug. 25, 2026

(54) NEGATIVE CAPACITANCE TUNING IN AN ACOUSTIC FILTER CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/773,973

(22) Filed: Jul. 16, 2024

(65) Prior Publication Data

US 2025/0062748 A1 Feb. 20, 2025

Related U.S. Application Data

(60) Provisional application No. 63/590,501, filed on Oct. 16, 2023, provisional application No. 63/520,448, filed on Aug. 18, 2023.

(51) Int. Cl.
*H03H 11/10* (2006.01)
*H03H 9/54* (2006.01)
*H03H 9/02* (2006.01)

(52) U.S. Cl.
CPC ............ *H03H 9/542* (2013.01); *H03H 11/10* (2013.01); *H03H 2009/02165* (2013.01); *H03H 2210/025* (2013.01)

(58) Field of Classification Search
CPC ............... H03H 9/542; H03H 9/02818; H03H 9/02952; H03H 11/10
(Continued)

(56) References Cited

U.S. PATENT DOCUMENTS 3,568,108 A 3/1971 Poirier et al.
4,924,195 A 5/1990 Gonda
(Continued)

FOREIGN PATENT DOCUMENTS

CN 107727125 A 2/2018
DE 102007028290 A1 1/2009
(Continued)

OTHER PUBLICATIONS

Elkholy, M. et al., "Low-Loss Integrated Passive CMOS Electrical Balance Duplexers With Single-Ended LNA," IEEE Transactions on Microwave Theory and Techniques, vol. 64, No. 5, May 2016, IEEE, pp. 1544-1559.

(Continued)

*Primary Examiner* — Rakesh B Patel
(74) *Attorney, Agent, or Firm* — Withrow & Terranova, P.L.L.C.

(57) ABSTRACT

Negative capacitance tuning in an acoustic filter circuit is provided. The acoustic filter circuit includes a tunable negative capacitance circuit that is coupled between an input node and an output node. The tunable negative capacitance circuit can be tuned according to embodiments of the present disclosure to present multiple negative capacitances, each of which is configured to cancel an electrical capacitance at a respective one of multiple operating frequencies. Herein, the electrical capacitance may be caused by an acoustic resonator coupled in parallel to the tunable negative capacitance circuit and May compromise the performance of the acoustic filter circuit at those operating frequencies. By tuning, either statically or dynamically, the negative capacitances between the input node and the output node, it is possible to cancel the electrical capacitance in order to improve the performance of the acoustic filter circuit across a broader operating frequency range.

19 Claims, 4 Drawing Sheets

(58) Field of Classification Search
USPC .......................................... 333/186, 193, 213
See application file for complete search history.

(56) References Cited

U.S. PATENT DOCUMENTS 6,242,843 B1 6/2001 Pohjonen et al.
6,862,441 B2 3/2005 Ella
7,034,638 B2 4/2006 Yamamoto et al.
7,161,434 B2 1/2007 Rhodes
7,367,095 B2 5/2008 Larson, III et al.
7,454,178 B2 11/2008 Block et al.
7,573,354 B2 8/2009 Nishihara et al.
7,656,228 B2 2/2010 Fukuda et al.
7,659,796 B2 2/2010 Funami et al.
7,692,270 B2 4/2010 Subramanyam et al.
7,791,436 B2 9/2010 Bardal et al.
7,804,374 B1 9/2010 Brown et al.
7,876,179 B2 1/2011 Bauer et al.
8,269,577 B2 9/2012 Inoue et al.
8,576,024 B2 11/2013 Erb et al.
8,620,250 B2 12/2013 Erb
9,041,484 B2 5/2015 Burgener et al.
9,190,979 B2 11/2015 Granger-Jones et al.
9,255,912 B2 2/2016 Johnston et al.
9,281,800 B2 3/2016 Tsuzuki
9,438,202 B2 9/2016 Reinhardt et al.
9,583,806 B2 2/2017 Cho et al.
9,705,473 B2 7/2017 David et al.
9,819,327 B2 11/2017 Maruthamuthu et al.
9,847,769 B2 12/2017 Khlat et al.
10,009,010 B2 6/2018 Kando et al.
10,243,537 B2 3/2019 Khlat
10,425,061 B1 9/2019 Varela Campelo
10,447,322 B2 10/2019 Wloczysiak
10,476,481 B2 11/2019 Chen et al.
10,873,317 B2 12/2020 Shen et al.
10,985,731 B2 4/2021 Khlat
11,050,412 B2 6/2021 Khlat et al.
11,095,268 B2 8/2021 Schmidhammer
11,165,412 B2 11/2021 Khlat et al.
11,165,413 B2 11/2021 Khlat et al.
11,323,097 B2 5/2022 Kankar et al.
11,742,818 B2 8/2023 Khlat
2002/0021192 A1 2/2002 Klee et al.
2002/0158717 A1 10/2002 Toncich
2002/0163400 A1 11/2002 Toncich
2003/0227338 A1 12/2003 Kawakubo et al.
2004/0119561 A1 6/2004 Omote
2006/0098723 A1 5/2006 Toncich et al.
2007/0030096 A1 2/2007 Nishihara et al.
2007/0107519 A1 5/2007 Liu et al.
2007/0131032 A1 6/2007 Liu
2007/0296513 A1 12/2007 Ruile et al.
2008/0024243 A1 1/2008 Iwaki et al.
2008/0065290 A1 3/2008 Breed et al.
2008/0129416 A1 6/2008 Volatier et al.
2009/0289526 A1 11/2009 Sinha et al.
2009/0315643 A1 12/2009 Yamakawa et al.
2010/0308933 A1 12/2010 See et al.
2012/0212304 A1 8/2012 Zhang et al.
2012/0313731 A1 12/2012 Burgener et al.
2013/0109332 A1 5/2013 Aigner
2014/0070905 A1 3/2014 Raieszadeh et al.
2014/0203887 A1 7/2014 Murata et al.
2015/0163044 A1 6/2015 Analui et al.
2016/0191012 A1 6/2016 Khlat et al.
2016/0191016 A1 6/2016 Khlat et al.
2016/0294423 A1 10/2016 Yatsenko et al.
2017/0040948 A1 2/2017 Levesque
2017/0048859 A1 2/2017 Hayakawa
2017/0093370 A1 3/2017 Khlat et al.
2017/0201233 A1 7/2017 Khlat
2017/0214389 A1 7/2017 Tsutsumi
2017/0230066 A1 8/2017 Little et al.
2017/0244382 A1 8/2017 Lear
2017/0264268 A1 9/2017 Schmidhammer
2018/0076793 A1 3/2018 Khlat et al.
2018/0123562 A1 5/2018 Bradley
2018/0159562 A1 6/2018 Bauder
2018/0234078 A1 8/2018 Wada et al.
2019/0081613 A1 3/2019 Nosaka
2019/0181907 A1 6/2019 Pfann et al.
2019/0199324 A1 6/2019 Matsumoto et al.
2019/0260355 A1 8/2019 Khlat
2019/0326944 A1 10/2019 Khlat et al.
2019/0393860 A1 12/2019 Shih et al.
2020/0028491 A1 1/2020 Kuroyanagi
2020/0028567 A1 1/2020 Ashworth
2020/0076366 A1 3/2020 Bahr et al.
2020/0099360 A1 3/2020 Khlat
2020/0099362 A1 3/2020 Khlat
2020/0099363 A1 3/2020 Khlat
2020/0099364 A1 3/2020 Khlat
2020/0136589 A1 4/2020 Khlat
2020/0162057 A1 5/2020 Nakamura
2020/0274519 A1 8/2020 Gamble et al.
2021/0067139 A1 3/2021 Komatsu et al.
2021/0194459 A1 6/2021 Alavi et al.
2021/0297097 A1 9/2021 Okuda
2021/0399750 A1 12/2021 Varela Campelo
2022/0385272 A1 12/2022 Sun et al.
2023/0083961 A1 3/2023 Komatsu et al.
2023/0093885 A1 3/2023 Ella et al.
2023/0134889 A1 5/2023 Costa
2023/0216485 A1 7/2023 Wu et al.
2023/0223920 A1 7/2023 Koohi et al.
2023/0223922 A1 7/2023 Koohi et al.
2023/0223926 A1 7/2023 Koohi et al.
2023/0299746 A1 9/2023 Levesque
2023/0318569 A1 10/2023 Jhung
2023/0402992 A1 12/2023 Noguchi et al.
2023/0412149 A1 12/2023 Khlat
2024/0014803 A1 1/2024 Khlat
2024/0053193 A1 2/2024 Khlat
2024/0097650 A1 3/2024 Khlat et al.
2024/0213956 A1 6/2024 Khlat et al.
2024/0258992 A1 8/2024 Khlat
2024/0333257 A1 10/2024 Khlat
2024/0333259 A1 10/2024 Khlat
2024/0364309 A1 10/2024 Khlat
2024/0413809 A1 12/2024 Khlat

FOREIGN PATENT DOCUMENTS

JP 3854212 B2 12/2006
JP 2009130831 A 6/2009
JP 4326063 B2 9/2009
JP 2022548348 A 11/2022
RU 166154 U1 11/2016
WO 2024034528 A1 2/2024

OTHER PUBLICATIONS

Kang, P. et al., "Dual-Band CMOS RF Front-End Employing an Electrical-Balance Duplexer an N-Path LNA for IBFD and FDD Radios," IEEE Transactions on Microwave Theory and Techniques, vol. 69, No. 7, Jul. 2021, IEEE, pp. 3528-3539.

Yu, X., "Design of reconfigurable multi-mode RF circuits," A dissertation submitted to the graduate faculty in partial fulfillment of the requirements for the degree of Doctor of Philosophy, Iowa State University, Ames, Iowa, 2013, 127 pages.

Khan, A.I. et al., "Negative Capacitance in a Ferroelectric Capacitor," Nature Materials, vol. 14, Feb. 2015, first published Dec. 2014, Macmillan Publishers Limited, pp. 182-186.

Ghosh, S. et al., "Experimental Observation of Electron-Phonon Interaction in Semiconductor on Solidly Mounted Thin-Film Lithium Niobate," 2022 IEEE MTT-S International Conference on Microwave Acoustics and Mechanics (IC-MAM), Jul. 18-20, 2022, Munich, Germany, IEEE, 4 pages.

Gokhale, V. et al., "Phonon-Electron Interactions in Piezoelectric Semiconductor Bulk Acoustic Wave Resonators," Scientific Reports, vol. 4, Article No. 5617, Jul. 2014, 10 pages.

(56) References Cited

OTHER PUBLICATIONS

Sis, S.A., "Ferroelectric-on-Silicon Switchable Bulk Acoustic Wave Resonators and Filters for RF Applications," A dissertation submitted in partial fulfillment of the requirements for the degree of Doctor of Philosophy (Electrical Engineering) in The University of Michigan, 2014, 152 pages.
Tirado, J.V., "Bulk Acoustic Wave Resonators and their Application to Microwave Devices," Ph.D Dissertation, Department of Telecommunications and Systems Engineering, Universitat Autonoma de Barcelona (UAB), 2010, 201 pages.
Qorvo US, Inc., "Acoustic LP filtering for High Frequency Spurious Harmonics Rejections," Technical Disclosure Commons, Dec. 13, 2022, Qorvo US, Inc., 8 pages.
Qorvo US, Inc., "Multipe Notch Filter Using On-Die BAW MIM Cap," Technical Disclosure Commons, Dec. 12, 2022, Qorvo US, Inc., 10 pages.

NEGATIVE CAPACITANCE TUNING IN AN ACOUSTIC FILTER CIRCUIT

RELATED APPLICATIONS

This application claims the benefit of U.S. provisional patent application Ser. No. 63/520,448, filed on Aug. 18, 2023, and U.S. provisional patent application Ser. No. 63/590,501, filed on Oct. 16, 2023, the disclosures of which are hereby incorporated herein by reference in their entireties.

FIELD OF THE DISCLOSURE

The technology of the disclosure relates generally to tuning a negative capacitance to cancel an electrical capacitance in an acoustic filter circuit.

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications. Accordingly, the wireless device may include a number of switches to enable dynamic and flexible couplings between the variety of circuits and/or components.

Acoustic resonators, such as Surface Acoustic Wave (SAW) resonators and Bulk Acoustic Wave (BAW) resonators, are used in many high-frequency communication applications. In particular, SAW resonators are often employed in filter networks that operate at frequencies up to 1.8 GHZ, and BAW resonators are often employed in filter networks that operate at frequencies above 1.5 GHz. Such SAW and BAW-based filters have flat passbands, steep filter skirts, and squared shoulders at the upper and lower ends of the passbands, and provide excellent rejection outside of the passbands. SAW and BAW-based filters also have relatively low insertion loss, tend to decrease in size as the frequency of operation increases, and are relatively stable over wide temperature ranges.

As such, SAW and BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

SUMMARY

Aspects disclosed in the detailed description include negative capacitance tuning in an acoustic filter circuit. The acoustic filter circuit includes a tunable negative capacitance circuit that is coupled between an input node and an output node. The tunable negative capacitance circuit can be tuned according to embodiments of the present disclosure to present multiple negative capacitances, each of which is configured to cancel an electrical capacitance at a respective one of multiple operating frequencies. Herein, the electrical capacitance may be caused by an acoustic resonator coupled in parallel to the tunable negative capacitance circuit and may compromise the performance of the acoustic filter circuit at those operating frequencies. By tuning, either statically or dynamically, the negative capacitances between the input node and the output node, it is possible to cancel the electrical capacitance in order to improve the performance of the acoustic filter circuit across a broader operating frequency range.

In one aspect, an acoustic filter circuit is provided. The acoustic filter circuit includes an acoustic resonator. The acoustic resonator is coupled between an input node and an output node. The acoustic resonator is configured to resonate in a series resonance frequency to pass a signal from the input node to the output node. The acoustic resonator is also configured to block the signal between the input node and the output node in an operating frequency range including multiple operating frequencies. The acoustic filter circuit also includes a tunable negative capacitance circuit. The tunable negative capacitance circuit is coupled in parallel to the acoustic resonator. The tunable negative capacitance circuit is configured to present multiple negative capacitances each tuned to cancel an electrical capacitance inherently caused by the acoustic resonator at a respective one of the multiple operating frequencies.

In another aspect, a wireless device is provided. The wireless device includes an acoustic filter circuit. The acoustic filter circuit includes an acoustic resonator. The acoustic resonator is coupled between an input node and an output node. The acoustic resonator is configured to resonate in a series resonance frequency to pass a signal from the input node to the output node. The acoustic resonator is also configured to block the signal between the input node and the output node in an operating frequency range including multiple operating frequencies. The acoustic filter circuit also includes a tunable negative capacitance circuit. The tunable negative capacitance circuit is coupled in parallel to the acoustic resonator. The tunable negative capacitance circuit is configured to present multiple negative capacitances each tuned to cancel an electrical capacitance inherently caused by the acoustic resonator at a respective one of the multiple operating frequencies.

In another aspect, a method for tuning negative capacitance in an acoustic filter circuit is provided. The method includes configuring an acoustic resonator to resonate in a series resonance frequency to pass a signal from an input node to an output node and block the signal between the input node and the output node in an operating frequency range including multiple operating frequencies. The method also includes presenting multiple negative capacitances each tuned to cancel an electrical capacitance inherently caused by the acoustic resonator at a respective one of the multiple operating frequencies.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
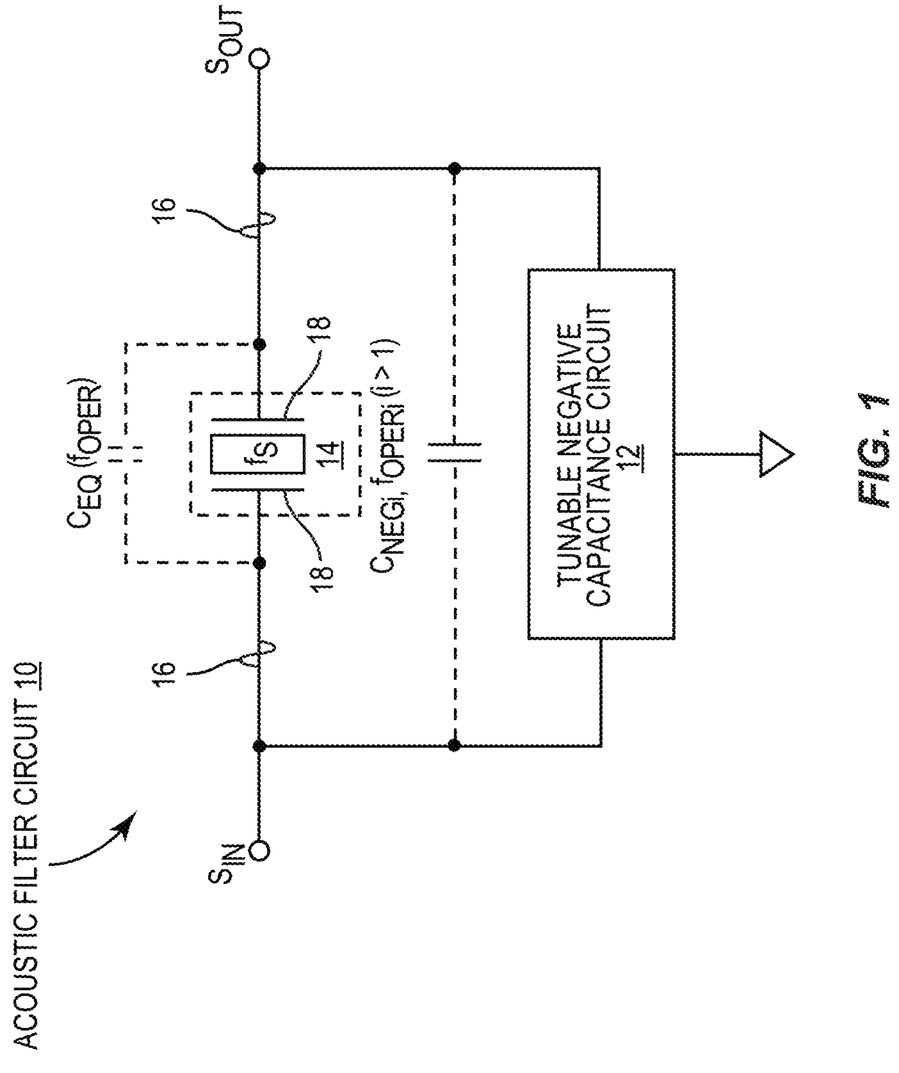
FIG. 1 is a schematic diagram of an exemplary acoustic filter circuit wherein a tunable negative capacitance circuit can be tuned to present multiple negative capacitances at multiple operating frequencies, respectively.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include negative capacitance tuning in an acoustic filter circuit. The acoustic filter circuit includes a tunable negative capacitance circuit that is coupled between an input node and an output node. The tunable negative capacitance circuit can be tuned according to embodiments of the present disclosure to present multiple negative capacitances, each of which is configured to cancel an electrical capacitance at a respective one of multiple operating frequencies. Herein, the electrical capacitance may be caused by an acoustic resonator coupled in parallel to the tunable negative capacitance circuit and may compromise performance of the acoustic filter circuit at those operating frequencies. By tuning, either statically or dynamically, the negative capacitances between the input node and the output node, it is possible to cancel the electrical capacitance in order to improve the performance of the acoustic filter circuit across a broader operating frequency range.

FIG. 1 is a schematic diagram of an exemplary acoustic filter circuit 10 wherein a tunable negative capacitance circuit 12 can be tuned, either statically or dynamically, to present multiple negative capacitances $C_{NEGi}$ (i>1) at multiple operating frequencies $f_{OPERi}$(i>1) in an operating frequency range $f_{OPER}$ ($f_{OPERi} \in f_{OPER}$), respectively. The acoustic filter circuit 10 includes an acoustic resonator 14, which is configured to resonate in a series resonance frequency $f_S$ to pass a signal 16 from an input node $S_{IN}$ to an output node Sour and block the signal 16 between the input node $S_{IN}$ and the output node Sour in the operating frequency range $f_{OPER}$. Herein, the series resonance frequency $f_S$ and the operating frequency range $f_{OPER}$ are a pair of non-overlapping frequency ranges.

The acoustic resonator 14 is typically made with a pair of metal electrodes 18 that can present an equivalent electrical capacitance $C_{EQ}$ in parallel to the acoustic resonator 14 in each of the operating frequencies $f_{OPERi}$ across the operating frequency range $f_{OPER}$. The electrical capacitance $C_{EQ}$ may be determined based on equation (Eq. 1) below.

$$C_{EQ} = I_{LOAD}(t) \Big/ \left(\frac{dV(t)}{dt}\right) \tag{Eq. 1}$$

In the equation (Eq. 1) above, $I_{LOAD}$(t) represents a time-variant load current flowing through a load (not shown) connected to the output node Sour and dV(t)/dt represents a time-variant voltage applied across the acoustic resonator 14. Notably, the electrical capacitance $C_{EQ}$ can cause the acoustic resonator 14 to resonate across the operating frequency range $f_{OPER}$, thus resulting in parallel resonance in the acoustic resonator 14. Consequently, the acoustic resonator 14 may not be able to effectively block the signal 16 across the operating frequency range $f_{OPER}$, thus compromising performance of the acoustic resonator 14. As such, it is desired to eliminate the electrical capacitance $C_{EQ}$ across the operating frequency range $f_{OPER}$.

In this regard, the tunable negative capacitance circuit 12 is provided in parallel to the acoustic resonator 14 between the input node $S_{IN}$ and the output node $S_{OUT}$. The tunable negative capacitance circuit 12 can be tuned according to various embodiments of the present disclosure to present different negative capacitances $C_{NEGi}$(i>1) at different operating frequencies $f_{OPERi}$(i>1) in the operating frequency range $f_{OPER}$ to thereby cancel, or at least reduce, the electrical capacitance $C_{EQ}$ across an entire operating frequency range of the acoustic resonator 14. By cancelling the electrical capacitance $C_{EQ}$ across the entire operating frequency range of the acoustic resonator 14, it is possible to improve signal rejection across the operating frequency range $f_{OPER}$ to thereby improve overall performance of the acoustic filter circuit 10.

Figure 2:
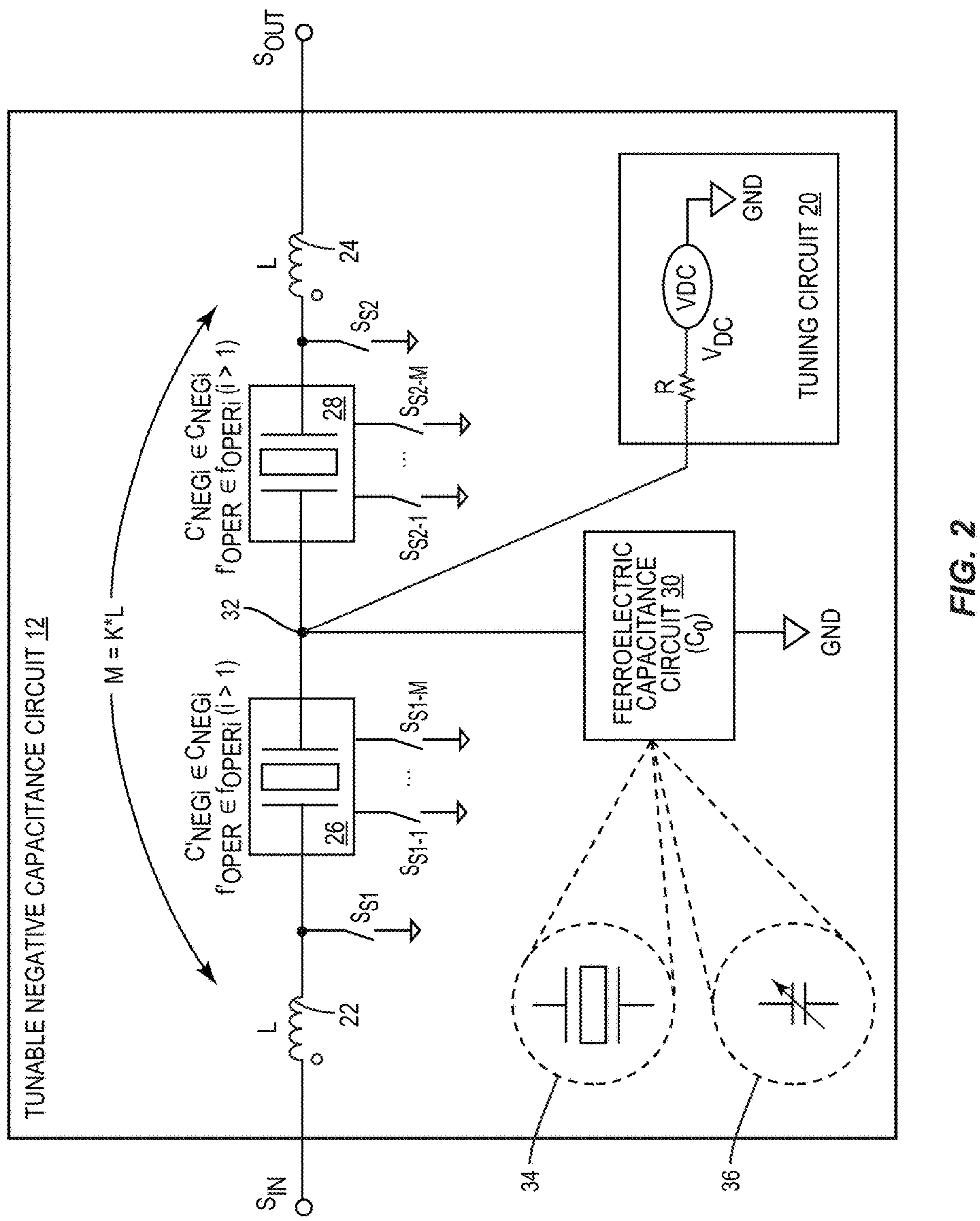
FIG. 2 is a schematic diagram of the tunable negative capacitance circuit in FIG. 1 configured according to an embodiment of the present disclosure.

FIG. 2 is a schematic diagram providing an exemplary illustration of the tunable negative capacitance circuit 12 in FIG. 1. Common elements between FIGS. 1 and 2 are shown therein with common element numbers and will not be re-described herein.

In an embodiment, the tunable negative capacitance circuit 12 includes a tuning circuit 20 configured to tune the tunable negative capacitance circuit 12, either statically or dynamically, to present different negative capacitances $C_{NEGi}$(i>1) at different operating frequencies $f_{OPERi}$(i>1) between the input node $S_{IN}$ and the output node Sour. More specifically, the tunable negative capacitance circuit 12 includes a first inductor 22 and a second inductor 24 that are negatively coupled to present a mutual inductance M, which is a function of a coupling factor K and respective inductance L(M=K*L) of the first inductor 22 and the second inductor 24.

The tunable negative capacitance circuit 12 also includes a first ferroelectric resonator 26, a second ferroelectric resonator 28, and a ferroelectric capacitance circuit 30. In an embodiment, the first inductor 22 and the first ferroelectric resonator 26 are coupled in series between the input node $S_{IN}$ and an intermediate node 32, and the second ferroelectric resonator 28 and the second inductor 24 are coupled in series between the intermediate node 32 and the output node Sour. The ferroelectric capacitance circuit 30, on the other hand, is coupled between the intermediate node 32 and a ground (GND).

In one embodiment, the ferroelectric capacitance circuit 30 can be a ferroelectric resonator 34 or a ferroelectric capacitor 36. The ferroelectric resonator 34 and the ferroelectric capacitor 36 can both be tuned by a tuning voltage $V_{DC}$ to present a tunable capacitance $C_0$ between the intermediate node 32 and the GND.

Herein, the first ferroelectric resonator 26 and the second ferroelectric resonator 28 will each present a respective one of the negative capacitances $C_{NEGi}$ (denoted as $C'_{NEG}$) at a respective one of the operating frequencies $f_{OPERi}$ (denoted as $f'_{OPER}$). The negative capacitance $C'_{NEG}$ and the operating frequency $f'_{OPER}$ can be defined by equations (Eq. 2 and 3) below.

$$C'_{NEG} = -\frac{C_0}{(1+N*K)} \quad \text{(Eq. 2)}$$

-continued $$f'_{OPER} = \frac{1}{2\pi\sqrt{L*C_0*N}} \quad \text{(Eq. 3)}$$

In the equations (Eq. 2 and 3), L represents a respective inductance of the first inductor 22 and the second inductor 24, K represents the coupling factor between the first inductor 22 and the second inductor 24, $C_0$ represents the tunable capacitance presented by the ferroelectric capacitance circuit 30, and N is a positive integer greater than one (N>1). As shown in the equations (Eq. 2 and 3), the negative capacitances $C'_{NEG}$ and the operating frequency $f'_{OPER}$ are both functions of the tunable capacitance $C_0$. As such, the tunable negative capacitance circuit 12 can be tuned to provide any of the negative capacitances $C_{NEGi}$ (i>1) in any of the operating frequencies $f_{OPERi}$ (i>1) by adjusting the tunable capacitance $C_0$.

In this regard, the tuning circuit 20 can be configured to apply the tuning voltage $V_{DC}$ between the intermediate node 32 and the GND to thereby tune the ferroelectric capacitance circuit 30 to adjust the tunable capacitance $C_0$.

In an embodiment, the tuning circuit 20 may include a resistor R and a voltage source VDC that are coupled in series between the intermediate node 32 and the GND.

In an embodiment, the tunable negative capacitance circuit 12 can include multiple shunt switches, namely $S_{S1}$, $S_{S2}$, $S_{S1-1}$-$S_{S1-M}$, and $S_{S2-1}$-$S_{S2-M}$, that are configured as illustrated in FIG. 2. In an embodiment, the tuning circuit 20 may close the shunt switches $S_{S1}$ and $S_{S2}$, while tuning the ferroelectric capacitance circuit 30, to thereby isolate the input node $S_{IN}$ and the output node $S_{OUT}$ from being impacted by the tuning voltage $V_{DC}$. In addition, the tuning circuit 20 may selectively close any one or more of the shunt switches $S_{S1-1}$-$S_{S1-M}$ and $S_{S2-1}$-$S_{S2-M}$ to thereby change the tuning voltage $V_{DC}$.

Figure 3:
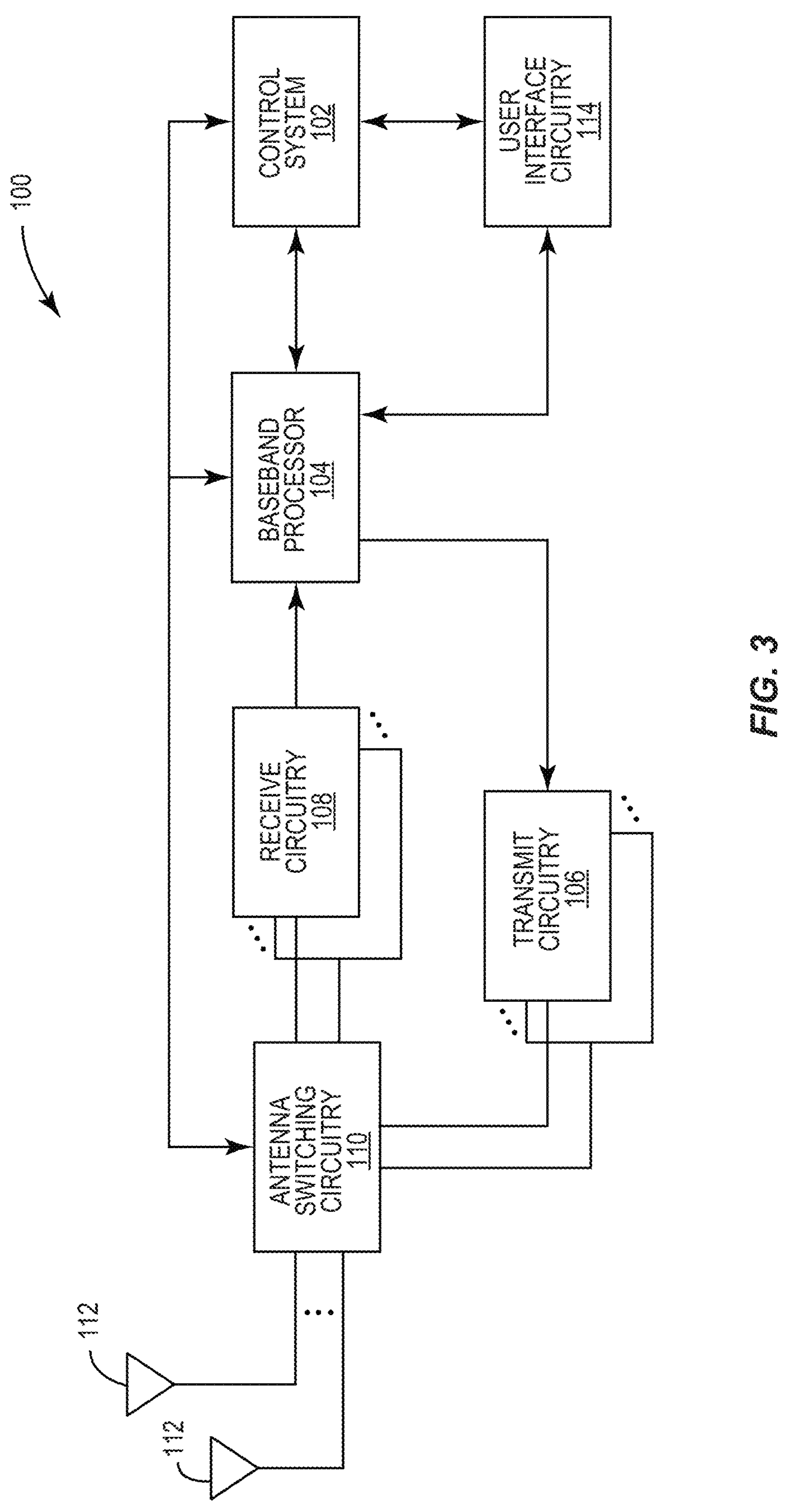
FIG. 3 is a schematic diagram of an exemplary communication device wherein the acoustic filter circuit of FIG. 1 can be provided.

The acoustic filter circuit 10 of FIG. 1 can be provided in a communication device to support the embodiments described above. In this regard, FIG. 3 is a schematic diagram of an exemplary communication device 100 wherein the acoustic filter circuit 10 of FIG. 1 can be provided.

Herein, the communication device 100 can be any type of communication device, such as a mobile terminal, smart watch, tablet, computer, navigation device, access point, and like wireless communication devices that support wireless communications, such as cellular, wireless local area network (WLAN), Bluetooth, and near field communications. The communication device 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using an analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

In an embodiment, the acoustic filter circuit 10 of FIG. 1 can be provided in the transmit circuitry 106, the receive circuitry 108, and/or the antenna switching circuitry 110. Understandably, the acoustic filter circuit 10 can also be provided anywhere else in the communication device 100.

Figure 4:
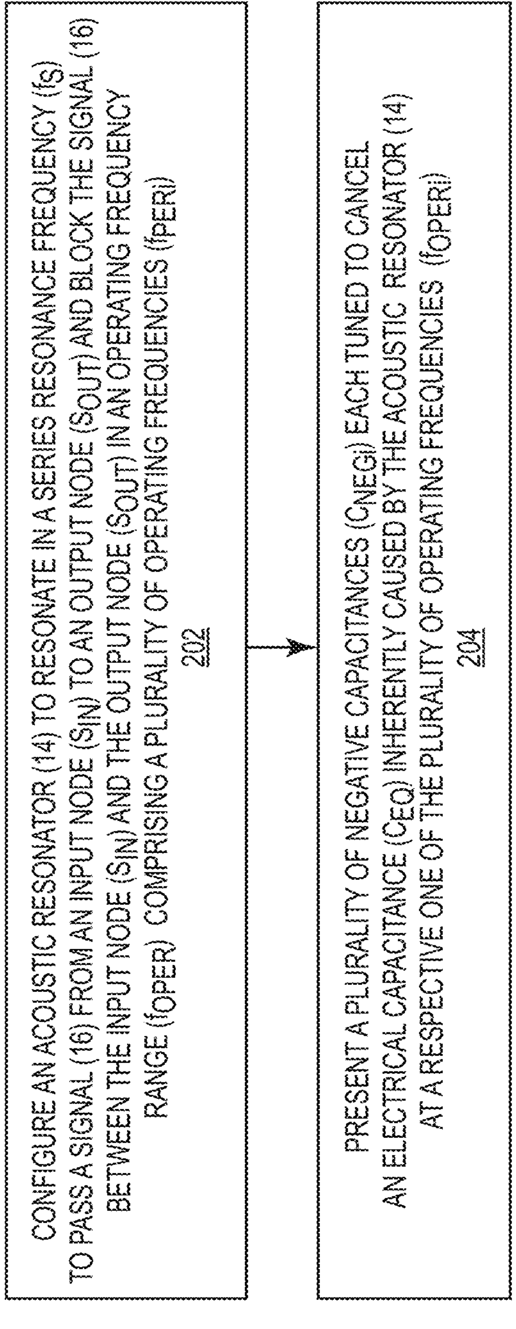
FIG. 4 is a flowchart of an exemplary process for tuning negative capacitance in the acoustic filter circuit of FIG. 1.

In an embodiment, the acoustic filter circuit 10 can also be tuned in accordance with a process. In this regard, FIG. 4 is a flowchart of an exemplary process 200 for tuning negative capacitance in the acoustic filter circuit 10 of FIG. 1.

Herein, the process 200 includes configuring the acoustic resonator 14 to resonate in the series resonance frequency ($f_S$) to pass the signal 16 from the input node $S_{IN}$ to the output node Sour and block the signal 16 between the input node $S_{IN}$ and the output node Sour in the operating frequency range $f_{OPER}$ that includes the operating frequencies $f_{PERi}$ (step 202). The process 200 also includes presenting the negative capacitances $C_{NEGI}$ each tuned to cancel the electrical capacitance $C_{EQ}$ inherently caused by the acoustic resonator 14 at the respective one of the operating frequencies $f_{OPERi}$ (step 204).

Those skilled in the art will recognize improvements and modifications to the embodiments of the present disclosure. All such improvements and modifications are considered within the scope of the concepts disclosed herein and the claims that follow.

What is claimed is:

1. A method for tuning a negative capacitance in an acoustic filter circuit comprising:

configuring an acoustic resonator to resonate in a series resonance frequency to pass a signal from an input node to an output node and block the signal between the input node and the output node in an operating frequency range comprising a plurality of operating frequencies nonoverlapping with the series resonance frequency; and presenting a plurality of negative capacitances each tuned to cancel an electrical capacitance inherently caused by the acoustic resonator at a respective one of the plurality of operating frequencies.

2. An acoustic filter circuit comprising:

an acoustic resonator coupled between an input node and an output node and configured to:

resonate in a series resonance frequency to pass a signal from the input node to the output node; and block the signal between the input node and the output node in an operating frequency range comprising a plurality of operating frequencies nonoverlapping with the series resonance frequency; and a tunable negative capacitance circuit coupled in parallel to the acoustic resonator and configured to present a plurality of negative capacitances each tuned to cancel an electrical capacitance inherently caused by the acoustic resonator at a respective one of the plurality of operating frequencies.

3. The acoustic filter circuit of claim 2, wherein the tunable negative capacitance circuit comprises:

a first inductor and a first ferroelectric resonator coupled in series between the input node and an intermediate node;

a second ferroelectric resonator and a second inductor coupled in series between the intermediate node and the output node;

a ferroelectric capacitance circuit coupled between the intermediate node and a ground and configured to present a tunable capacitance between the intermediate node and the ground; and a tuning circuit coupled between the intermediate node and the ground.

4. The acoustic filter circuit of claim 3, wherein the first inductor and the second inductor are negatively coupled to present a mutual inductance between the input node and the output node.

5. The acoustic filter circuit of claim 3, wherein the first ferroelectric resonator and the second ferroelectric resonator are each configured to present a respective one of the plurality of negative capacitances at a respective one of the plurality of operating frequencies.

6. The acoustic filter circuit of claim 5, wherein each of the respective one of the plurality of negative capacitances and the respective one of the plurality of operating frequencies is a function of the tunable capacitance.

7. The acoustic filter circuit of claim 3, wherein the ferroelectric capacitance circuit comprises a ferroelectric resonator that can be tuned to present the tunable capacitance.

8. The acoustic filter circuit of claim 3, wherein the ferroelectric capacitance circuit comprises a ferroelectric capacitor that can be tuned to present the tunable capacitance.

9. The acoustic filter circuit of claim 3, wherein the tuning circuit is configured to apply a tuning voltage between the intermediate node and the ground to thereby tune the ferroelectric capacitance circuit to present the tunable capacitance.

10. The acoustic filter circuit of claim 9, further comprising a plurality of shunt switches and the tuning circuit is further configured to selectively close one or more of the plurality of shunt switches to thereby isolate the input node and the output node while tuning the ferroelectric capacitance circuit.

11. A wireless device comprising an acoustic filter circuit, the acoustic filter circuit comprises:

an acoustic resonator coupled between an input node and an output node and configured to:

resonate in a series resonance frequency to pass a signal from the input node to the output node; and block the signal between the input node and the output node in an operating frequency range comprising a plurality of operating frequencies nonoverlapping with the series resonance frequency; and a tunable negative capacitance circuit coupled in parallel to the acoustic resonator and configured to present a plurality of negative capacitances each tuned to cancel an electrical capacitance inherently caused by the acoustic resonator at a respective one of the plurality of operating frequencies.

12. The wireless device of claim 11, wherein the tunable negative capacitance circuit comprises:

a first inductor and a first ferroelectric resonator coupled in series between the input node and an intermediate node;

a second ferroelectric resonator and a second inductor coupled in series between the intermediate node and the output node;

a ferroelectric capacitance circuit coupled between the intermediate node and a ground and configured to present a tunable capacitance between the intermediate node and the ground; and a tuning circuit coupled between the intermediate node and the ground.

13. The wireless device of claim 12, wherein the first inductor and the second inductor are negatively coupled to present a mutual inductance between the input node and the output node.

14. The wireless device of claim 12, wherein the first ferroelectric resonator and the second ferroelectric resonator are each configured to present a respective one of the plurality of negative capacitances at a respective one of the plurality of operating frequencies.

15. The wireless device of claim 14, wherein each of the respective one of the plurality of negative capacitances and the respective one of the plurality of operating frequencies is a function of the tunable capacitance.

16. The wireless device of claim 12, wherein the ferroelectric capacitance circuit comprises a ferroelectric resonator that can be tuned to present the tunable capacitance.

17. The wireless device of claim 12, wherein the ferroelectric capacitance circuit comprises a ferroelectric capacitor that can be tuned to present the tunable capacitance.

18. The wireless device of claim 12, wherein the tuning circuit is configured to apply a tuning voltage between the intermediate node and the ground to thereby tune the ferroelectric capacitance circuit to present the tunable capacitance.

19. The wireless device of claim 18, wherein the tunable negative capacitance circuit further comprises a plurality of shunt switches and the tuning circuit is further configured to selectively close one or more of the plurality of shunt switches to thereby isolate the input node and the output node while tuning the ferroelectric capacitance circuit.

* * * * *